United States Patent
Choi et al.

(10) Patent No.: US 7,109,896 B2
(45) Date of Patent: Sep. 19, 2006

(54) VARIABLE LENGTH CODING APPARATUS AND VARIABLE LENGTH CODING METHOD

(75) Inventors: Byung-sun Choi, Gunpo-si (KR); Jun-hyuk Ko, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/014,859

(22) Filed: Dec. 20, 2004

(65) Prior Publication Data

US 2005/0140529 A1 Jun. 30, 2005

(30) Foreign Application Priority Data

Dec. 27, 2003 (KR) .................. 10-2003-0098231

(51) Int. Cl.
*H03M 7/40* (2006.01)
(52) U.S. Cl. .................. 341/67; 341/60; 341/63; 341/65
(58) Field of Classification Search .......... 341/60, 341/67

See application file for complete search history.

(56) References Cited

U.S. PATENT DOCUMENTS 5,079,548 A * 1/1992 Fujiyama et al. ............. 341/67
5,173,695 A * 12/1992 Sun et al. ..................... 341/67
5,446,916 A * 8/1995 Derovanessian et al. .... 709/236
5,650,905 A * 7/1997 Bakhmutsky ................ 341/67
5,973,627 A * 10/1999 Bakhmutsky ................ 341/67
6,014,095 A * 1/2000 Yokoyama ................... 341/67
6,339,386 B1 * 1/2002 Cho ............................ 341/67
2003/0038736 A1 2/2003 Becker et al.

FOREIGN PATENT DOCUMENTS

JP 2000-216687 8/2000
KR 2000-45256 A 7/2000

* cited by examiner

*Primary Examiner*—Rexford Barnie
*Assistant Examiner*—Khai Nguyen
(74) *Attorney, Agent, or Firm*—Stanzione & Kim, LLP

(57) ABSTRACT

A variable length coding apparatus and a variable length coding method including a prepacking unit which processes two data items, each of which is formed with a code value and a code length and is received from a variable length code generator at each clock cycle, into one data item and outputs the processed data item to perform bitstream packing. With this structure, a variable length coding apparatus operating at a high speed without idling can be implemented.

26 Claims, 7 Drawing Sheets

VARIABLE LENGTH CODING APPARATUS AND VARIABLE LENGTH CODING METHOD

CROSS-REFERENCE TO RELATED APPLICATIONS

This application claims priority under U.S.C § 119 from Korean Patent Application No. 2003-98231, filed on Dec. 27, 2003, the content of which is incorporated herein by reference in its entirety.

BACKGROUND OF THE INVENTION

1. Field of the Invention

The present general inventive concept relates to moving picture encoding, and more particularly, to a variable length coding apparatus and a variable length coding method.

2. Description of the Related Art

In order to encode moving pictures with high picture quality, a moving picture encoding apparatus operating at a high speed is needed. In order to operate the moving picture encoding apparatus, a discrete cosine transform (DCT) apparatus, a quantization/dequantization apparatus, and a variable length coding (VLC) coding apparatus are indispensable. In order to operate the DCT apparatus, the apparatus is usually designed to be able to process two data items at each clock cycle.

FIG. 1 is a schematic block diagram of a conventional moving picture encoding apparatus.

Referring to FIG. 1, the moving picture encoding apparatus comprises a DCT/quantization unit 110, a run length coding (RLC) unit 120, a variable length code generation unit 130, a VLC table 140, a buffer 150, and a bitstream packing unit 160. The encoding apparatus performs DCT/quantization, RLC, and VLC in units of 8×8 blocks.

The DCT/quantization unit 110 performs DCT and quantization in units of 8×8 data blocks, and the RLC unit 120 performs the RLC of data output from the DCT/quantization unit 110.

A variable length coding (VLC) apparatus 100 for performing the VLC comprises the variable length code generation unit 130, the VLC table 140, the buffer 150, and the bitstream packing unit 160.

The variable length code generation unit 130 refers to the VLC table 140 while taking output data of the RLC unit 120 as input symbols, and then outputs two data items, each formed with a code value and a code length corresponding to each input symbol, to the buffer 150.

The buffer 150 stores the data items output from the variable length code generation unit 130 and then transfers the data items to the bitstream packing unit 160.

The bitstream packing unit 160 generates a final bitstream and in doing so, reads the code value and code length information of each symbol from the buffer 150 and generates a continuous bitstream. Information for producing a bitstream includes a motion vector, a code mode, and a variety of header information, which are not shown in FIG. 1.

FIG. 2 is a flowchart of the steps performed by a variable length coding process of the conventional moving picture encoding apparatus of FIG. 1.

Referring to FIGS. 1 and 2, first, the DCT/quantization unit 110 receives 2N-bit data 30 formed with N-bit data 0 10 and N-bit data 1 20 at each clock cycle, performs the DCT and quantization for the data in units of 8×8 blocks, and then outputs two data items of the processed resulting data to the RLC unit 120 at each clock cycle in operation 210. Accordingly, the DCT/quantization unit 110 processes 64 data items for 32 clock cycles when a data item is an 8×8 block.

Next, the RLC unit 120 receives two data items of the quantized data at each clock cycle and performs run length encoding in operation 220, and outputs two data items, each formed with the length of continuous 0's and a level value. The output of the RLC unit 120 varies according to images and if there are no continuous 0's, 64 data items are output for 32 clock cycles when a data item is an 8×8 block. However, in an ordinary image, the output of the DCT/quantization unit 110 has many continuous 0's and therefore the RLC unit 120 outputs much less data items than 64 for 32 clock cycles when a data item is an 8×8 block.

The variable length code generation unit 130 receives and outputs two data items at each clock cycle in operation 230. That is, the variable length code generation unit 130 refers to the VLC table 140 while taking the output data of the RLC unit 120 as input symbols, and then outputs the two data items, each formed with a code value and a code length corresponding to each input symbol. That is, the two data items are output at each clock cycle.

The two data items output from the variable length code generation unit 130 at each clock cycle are stored in the buffer 150 in operation 240.

Then, the bitstream packing unit 160 receives one of the data items stored in the buffer 150 at each clock cycle and outputs a continuous bitstream in operation 250. That is, since the bitstream packing unit 160 can process a maximum of one input data item at each clock cycle, and the data output rate of the variable length code generation unit 130 can be twice as high as the data input rate of the bitstream packing unit 160 at a maximum, the buffer 150 is placed between the variable length code generation unit 130 and the bitstream packing unit 160 as shown in FIG. 1.

It is a problem that the output rate of the variable length code generation unit 130 is twice as high as the input rate of the bitstream packing unit 160 in the worst case. As the quality of pictures being encoded is higher, the output rate of the variable code generation unit 130 approaches twice the input rate of the bitstream packing unit 160. In such cases, processing two data items at each clock cycle before the bitstream packing unit 160 for high-speed processing is of no use. That is, when a data item is an 8×8 blocks, though processing data items before the front end of the bitstream packing unit 160 is finished in 32 clock cycles, 64 clock cycles are needed in the worst case in the bitstream packing unit 160 and a situation where data items are idling before the front end of the bitstream packing unit 160 for 32 clock cycles takes place.

SUMMARY OF THE INVENTION

The present general inventive concept provides a variable length coding apparatus and a variable length coding method by which idling of elements is minimized and a high speed operation is enabled.

The present general inventive concept makes two VLC symbols into one symbol in advance and then performs bitstream packing, and by doing so, in addition to the quantization apparatus, the variable length coding apparatus is also made to be able to process two data items at each clock cycle.

Additional aspects and advantages of the present general inventive concept will be set forth in part in the description which follows and, in part, will be obvious from the description, or may be learned by practice of the general inventive concept.

The foregoing and/or other aspects and advantages of the present general inventive concept may be achieved by providing a variable length coding apparatus comprising a prepacking unit which processes $2^N$ (N=1, 2, ...) data items, each of which is formed with a code value and a code length and is received from a variable length code generation unit at each clock cycle, into one data item, and outputs the processed data item to perform bitstream packing.

The foregoing and/or other aspects and advantages of the present general inventive concept may also be achieved by providing a variable length coding apparatus comprising a variable length code generation unit to refer to a variable length code table corresponding to two input symbols received at each clock cycle to output two data items, a prepacking unit which receives the two data items output from the variable length code generation unit at each clock cycle, and processes the two data items into one data item, and a bitstream packing unit to receive the one data item output from the prepacking unit at each clock cycle and to perform bitstream packing of the data item.

Each of the two data items, a first data item and a second data item, output from the variable length code generation unit may be formed with a code value and a code length, and the prepacking unit may comprise an addition unit to add the code length of the first data item and the code length of the second data item, a shift unit to shift the code value of the first data item by the code length of the second data item, and an OR operation unit to perform an OR operation of the shifted code value of the first data item and the code value of the second data item, and the prepacking unit can output one data item formed with the code length output from the addition unit and the code value output from the OR operation unit at each clock cycle.

The foregoing and/or other aspects and advantages of the present general inventive concept may also be achieved by providing a variable length coding apparatus comprising a variable length code generation unit to refer to a variable length code table corresponding to $2^N$ (N=1, 2, ...) input symbols received at each clock cycle to output $2^N$ data items, a prepacking unit which receives the $2^N$ data items output from the variable length code generation unit at each clock cycle, and processes the $2^N$ data items into one data item, and a bitstream packing unit to receive the one data item output from the prepacking unit at each clock cycle and to perform bitstream packing of the data item.

The prepacking unit may comprise N stages, and each of M-th stage (M=1, ..., N) may comprise $2^{N-M}$ subunits, and with the $2^N$ data items output from the variable length coding unit, each of the subunits of M-th stage (M=1, ..., N−1) can prepack two data items into one data item and transfer the data item to the subunits of (M+1)-th stage, and the subunit of N-th stage can prepack two data items into one data item and output the one data item.

Each of the subunits can receive two data items, a first data item and a second data item, each of which is formed with a code value and a code length, and may comprise an addition unit to add the code length of the first data item and the code length of the second data item, a shift unit to shift the code value of the first data item by the code length of the second data item, and an OR operation unit to perform an OR operation of the shifted code value of the first data item and the code value of the second data item, and each of the subunits can output one data item formed with the code length output from the addition unit and the code value output from the OR operation unit at each clock cycle.

The foregoing and/or other aspects and advantages of the present may also be achieved by providing a variable length coding method comprising processing $2^N$ (N=1,2, ...) data items, each of which is formed with a code value and a code length and is received from a variable length code generator at each clock cycle, into one data item, and outputting the processed data item to perform bitstream packing.

The forgoing and/or other aspects and advantages of the present general inventive concept may also be achieved by providing a variable length coding method comprising forming two data items by referring to a variable length code table corresponding to two input symbols received at each clock cycle, processing the two data items formed at each clock cycle into one data item, and performing bitstream packing of the data item.

The foregoing and/or other aspect of the present general inventive concept may also be achieved by providing a variable length coding method comprising forming $2^N$ data items by referring to a variable length code table corresponding to $2^N$ (N=1,2, ...) input symbols received at each clock cycle, processing the $2^N$ data items formed at each clock cycle into one data item, and receiving performing bitstream packing of the data item.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
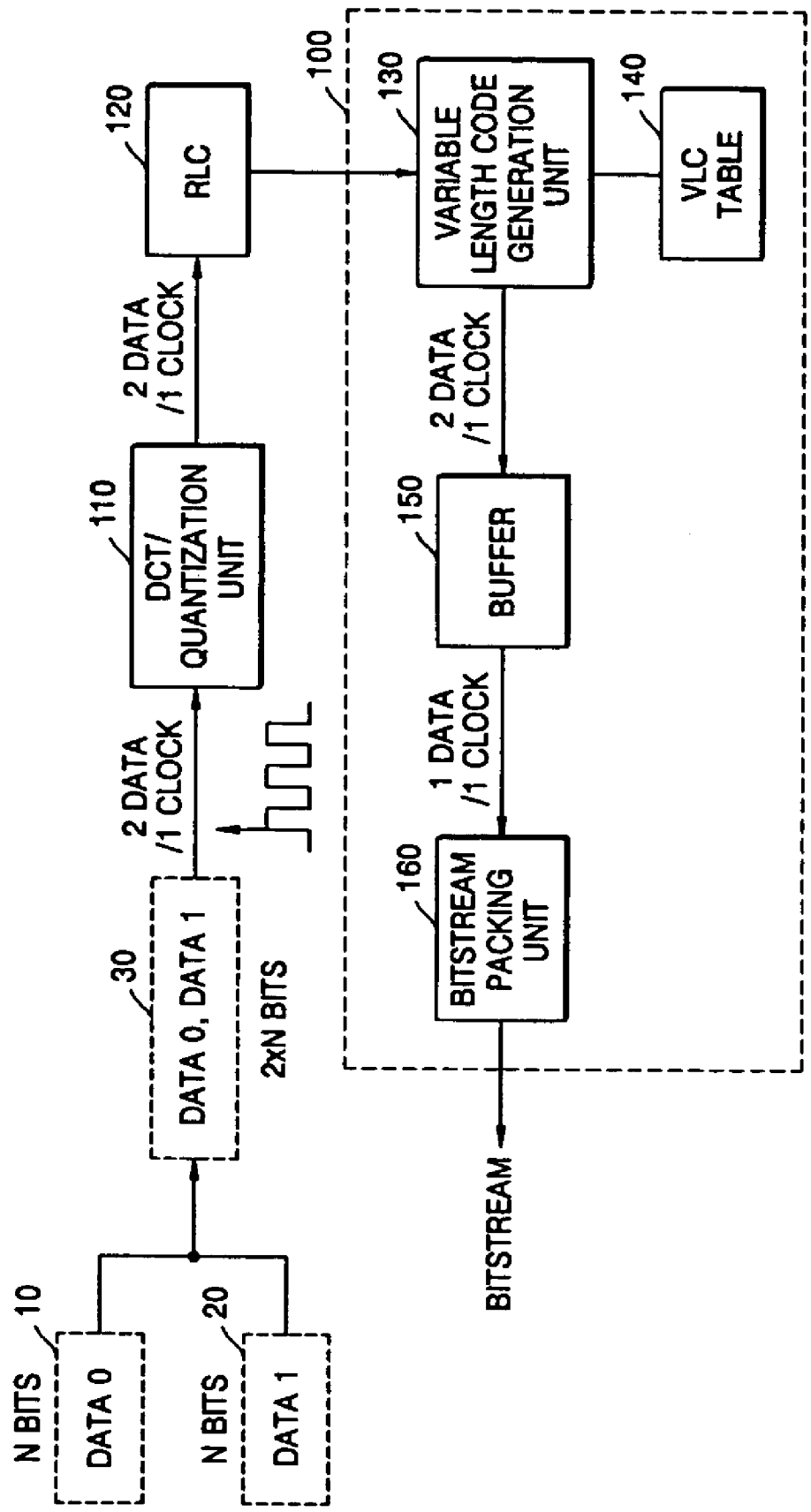
FIG. 1 is a schematic block diagram illustrating a conventional moving picture encoding apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
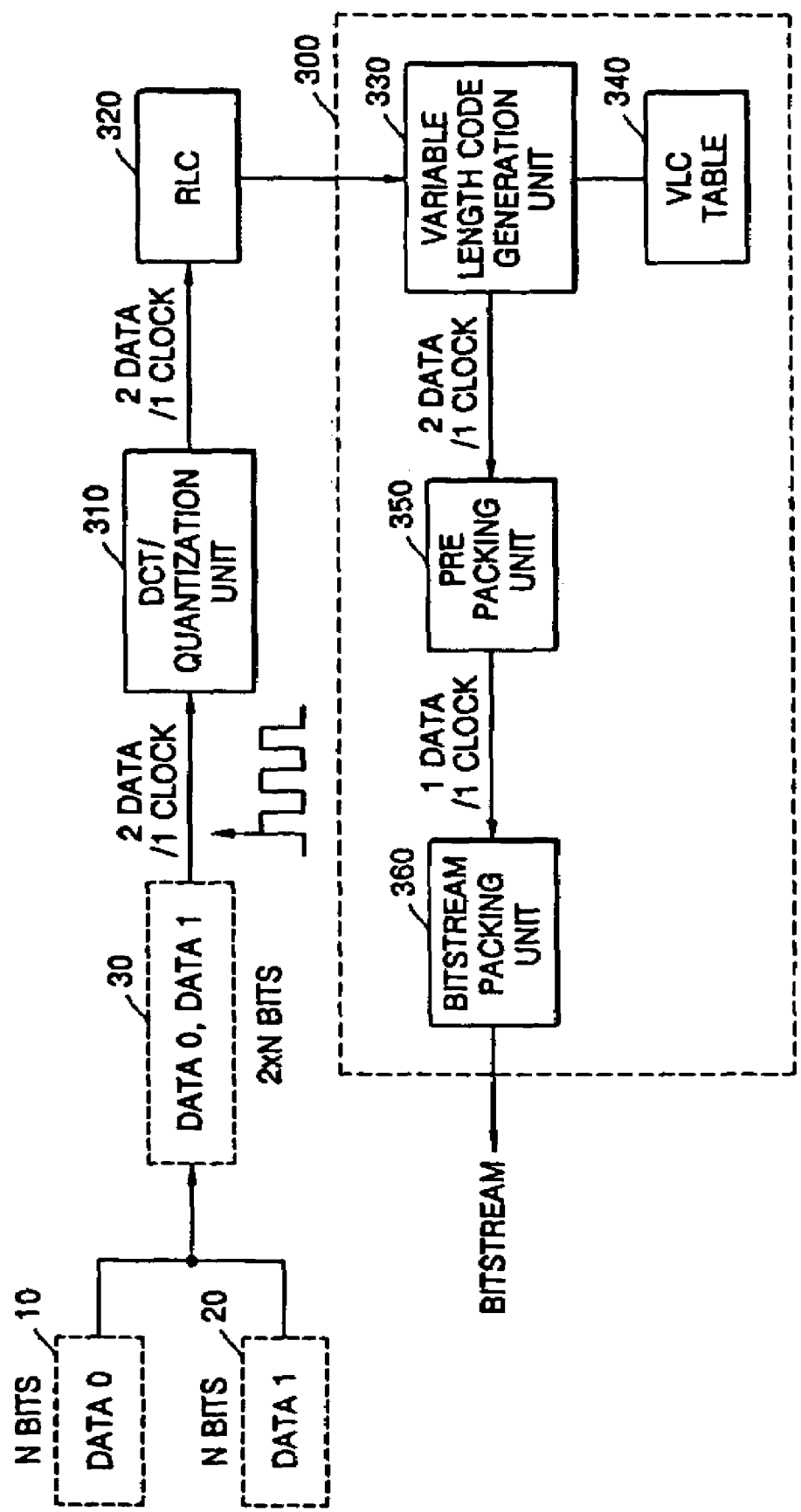
FIG. 3 is a schematic block diagram illustrating a moving picture encoding apparatus having a variable length coding apparatus according to an embodiment of present general inventive concept.

Referring to FIG. 3, a moving picture encoding apparatus may comprise a DCT/quantization unit 310, an RLC unit 320, a variable length code generation unit 330, a VLC table 340, a prepacking unit 350, and a bitstream packing unit 360. The moving picture encoding apparatus can perform DCT/quantization, RLC, and VLC in units of 8×8 blocks.

The DCT/quantization unit 310 can perform the DCT and quantization in units of 8×8 data blocks, and the RLC unit 320 performs the RLC of data output from the DCT/quantization unit 310. A variable length coding (VLC) apparatus 300 may comprise the variable length code generation unit 330, the VLC table 340, the prepacking unit 350, and the bitstream packing unit 360.

The variable length code generation unit 330 refers to the VLC table 340 while taking the output data of the RLC unit 320 as input symbols, and then outputs data items, each having a code value and a code length, corresponding to each input symbol, to the prepacking unit 350.

The prepacking unit 350 processes the data items output from the variable length code generation unit 330, and transfers the processed data to the bitstream packing unit 360. The prepacking unit 350 can receive two data items from the variable length code generation unit 330 at each clock cycle, process the two data items into one data item, and output one data item to the bitstream packing unit 360 at each clock cycle. By placing the prepacking unit 350, which can process two data items at each clock cycle, between the variable length code generation unit 330 and the bitstream packing unit 360 instead of a buffer, which simply stores data, the variable length coding apparatus 300 and the moving picture encoding apparatus can process two data items at each clock cycle. The prepacking unit 350 will be explained in detail below.

The bitstream packing unit 360 generates a final bitstream and in doing so, reads information about the code value and the code length information of each data item output from the prepacking unit 350 and generates a continuous bitstream. Information corresponding to generation of the bitstream may include a motion vector, a coding mode, and a variety of header information, which are not shown in FIG. 3.

Figure 4:
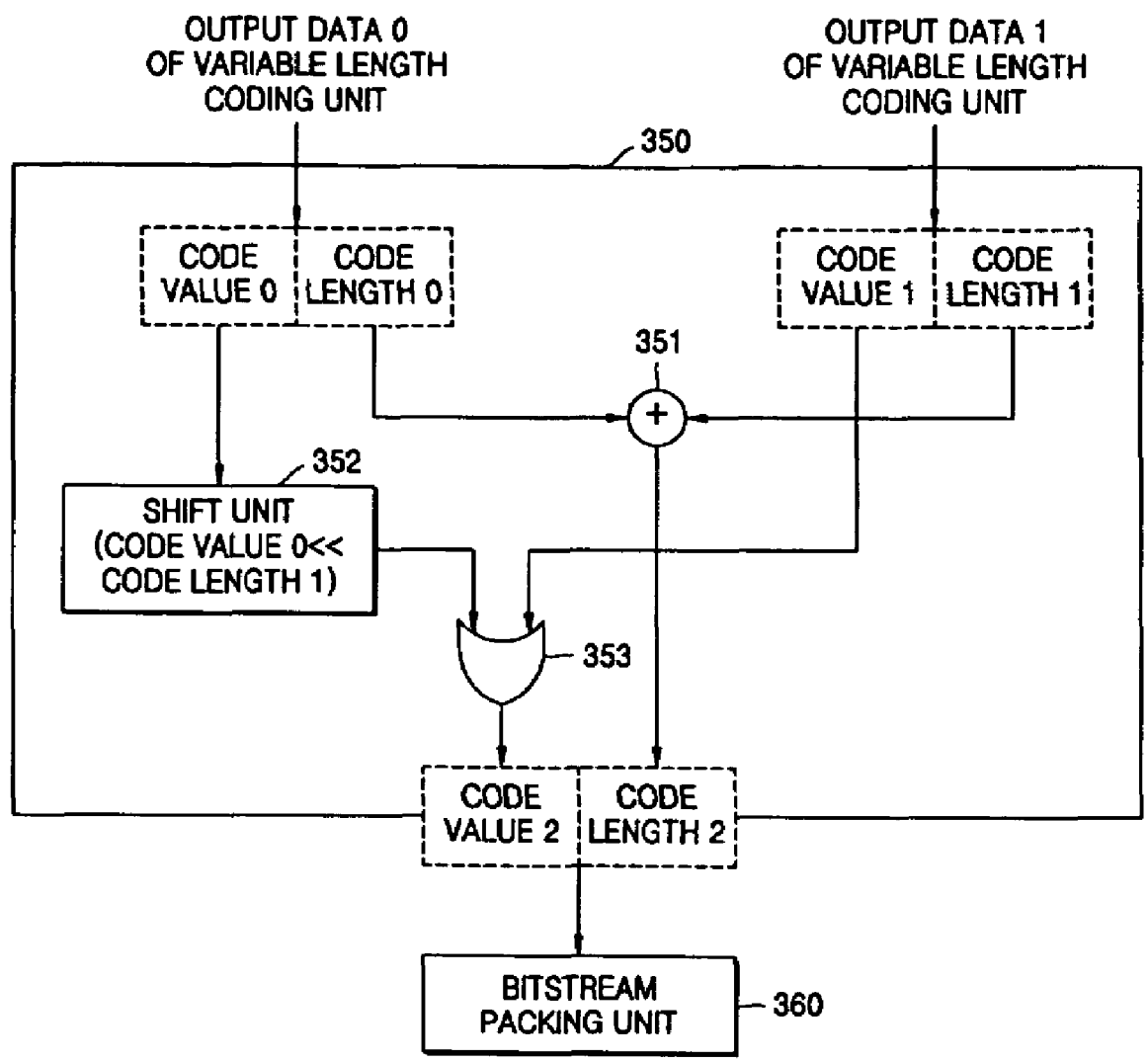
FIG. 4 is a block diagram illustrating a detailed structure of a prepacking unit of FIG. 3, which receives two data items and prepacks the two data items into one data item.

FIG. 4 is a block diagram illustrating a detailed structure of the prepacking unit 350 of FIG. 3.

Referring to FIG. 4, the prepacking unit 350 may comprise an addition unit 351, a shift unit 352, and an OR operation unit 353.

The prepacking unit 350 can receive the two data items from the variable length code generation unit 330 at each clock cycle and each of the two data items comprises the code value and the code length. For example, as shown in FIG. 4, assuming that the two data items are a first data item and a second data item, the first data item comprises a code value 0 and a code length 0, and the second data item comprises a code value 1 and a code length 1.

The addition unit 351 adds the code lengths 0 and 1 of the two data items. That is, the addition unit 351 adds the code length 0 of the first data item and the code length 1 of the second data item. The shift unit 352 shifts the code value 0 of the first data item by the code length 1 of the second data item. A barrel shifter can be used as the shift unit 352.

The OR operation unit 353 performs an OR operation of the output value of the shift unit 352 and the code value 1 of the second data item.

Thus, with the resulting value of the OR operation unit 353 as a code value 2 and the resulting value of the addition unit 351 as a code length 2, the prepacking unit can output a data item of the code value 2 and the code length 2.

Figure 5:
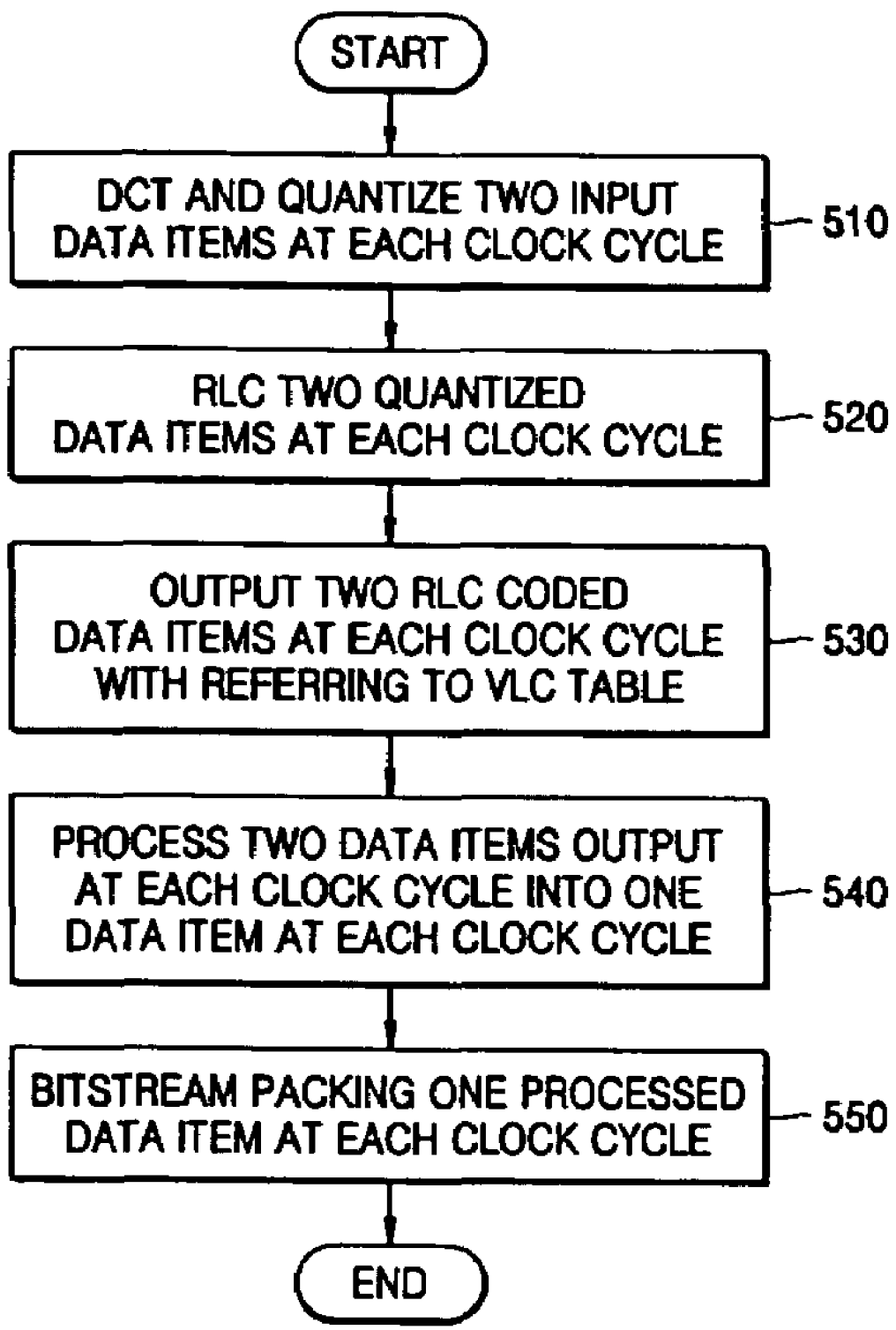
FIG. 5 is a flowchart illustrating operations performed by the moving picture encoding apparatus of FIG. 3.

FIG. 5 is a flowchart illustrating operations performed by a moving picture encoding apparatus of FIG. 3.

Referring to FIGS. 3 and 5, first, the DCT/quantization unit 310 receives 2N-bit data 30 formed with N-bit data 0 10 and N-bit data 1 20 at each clock cycle, performs DCT and quantization of the data, and then outputs two data items of the processed resulting data to the RLC unit 320 at each clock cycle in operation 510. Accordingly, the DCT/quantization unit processes 64 data items for 32 clock cycles when a data item is an 8×8 block.

Next, the RLC unit 320 receives the two data items of the quantized data at each clock cycle and performs run length encoding (RLC) in operation 520, and outputs two data items, each formed with a length of continuous 0's and a level value. The output of the RLC unit 320 can vary according to images, and if there is no continuous 0's, 64 data items are output over 32 clock cycles when a data item is an 8×8 block. However, in an ordinary image, the output of the DCT/quantization unit 310 can have many continuous 0's and therefore the RLC unit 320 can output much less data items than 64 over 32 clock cycles when a data item is an 8×8 block.

The variable length code generation unit 330 receives the two data items output from the RLC unit 320, and outputs two data items at each clock cycle in operation 530. That is, the variable length code generation unit 330 refers to the VLC table 340 while taking the output data items of the RLC unit 320 as input symbols, and then outputs the two data items, each formed with the code value and the code length corresponding to each input symbol. That is, the two (code value, code length) data items are output at each clock cycle.

The two data items output from the variable length code generation unit 33 are transferred to the prepacking unit and processed into one data item (prepacked data item) in operation 540.

Next, the bitstream packing unit 360 receives the one data item (prepacked data item) output from the prepacking unit 350, at each clock cycle, and outputs a continuous bitstream in operation 550.

Figure 2:
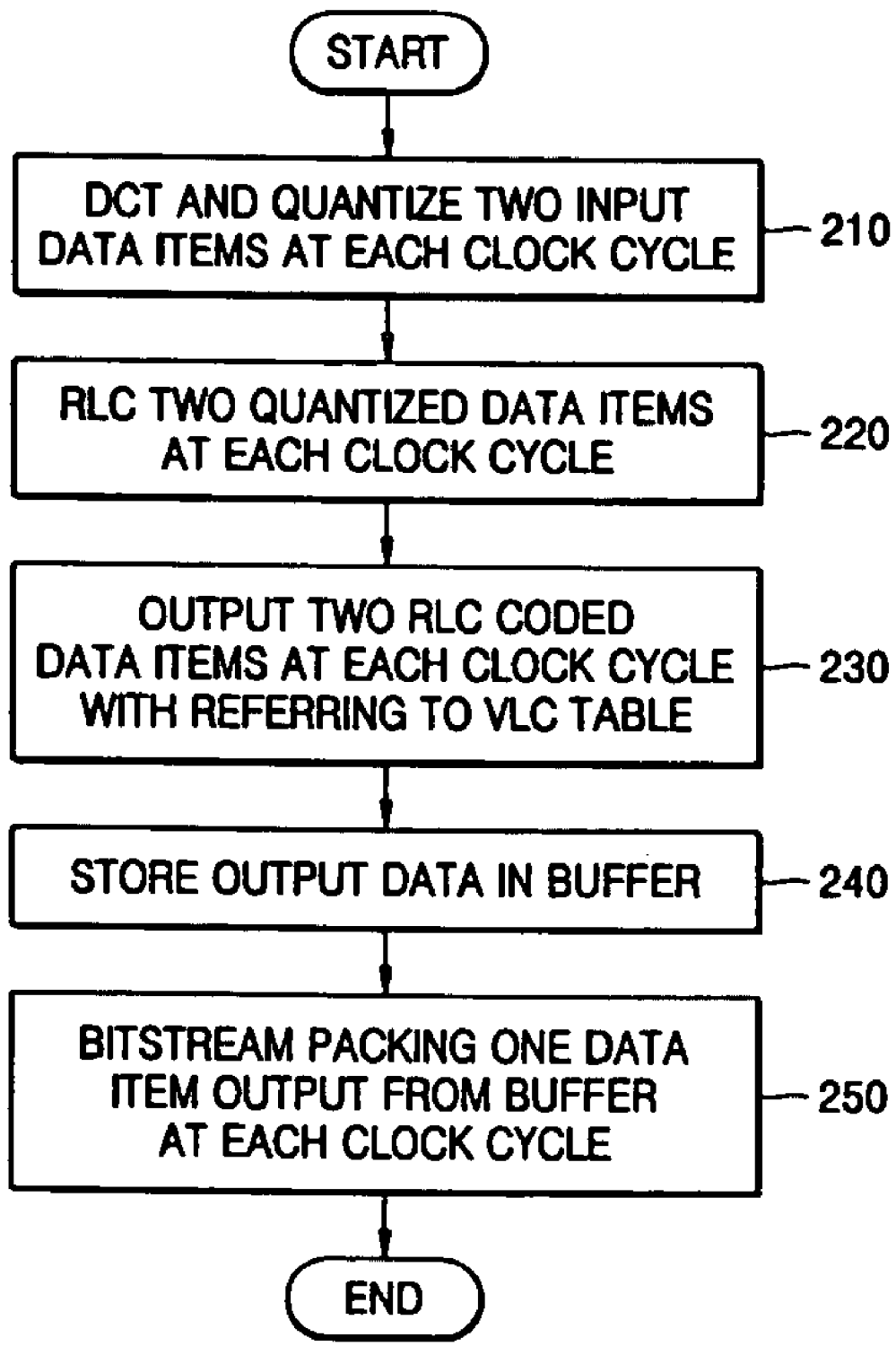
FIG. 2 is a flowchart illustrating operations performed by a conventional variable length coding process of the moving picture encoding apparatus of FIG. 1.
Figure 6:
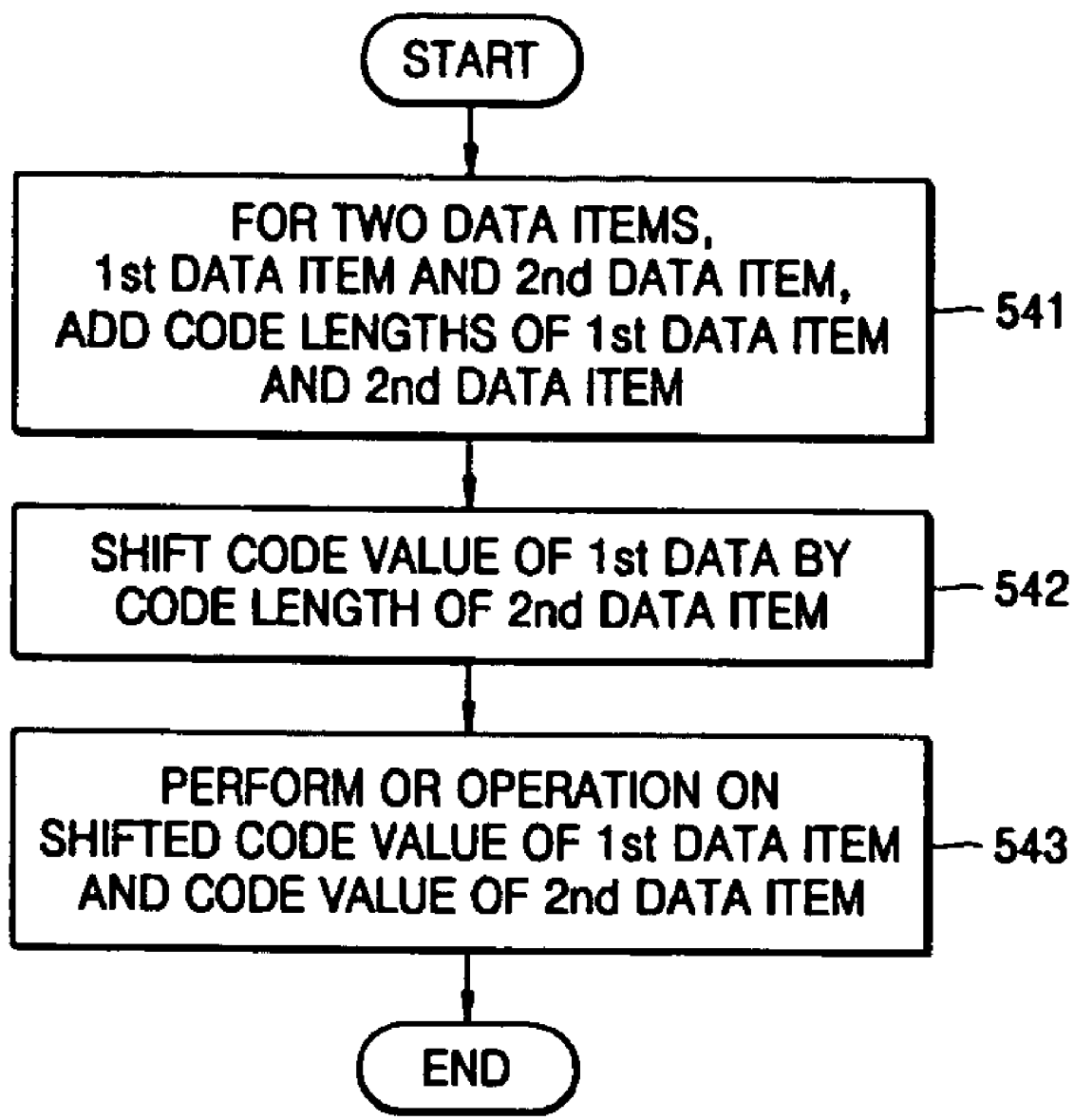
FIG. 6 is a flowchart illustrating a detailed process of a processing operation of FIG. 5.

Referring to FIGS. 2 and 6, the detailed process of the processing operation of FIG. 3 will now be explained.

With respect to the first data item and the second data item, the addition unit 351 adds the code lengths 0 and 1 of the first data item and the second data item in operation 541.

Then, the shift unit 352 shifts the code value 0 of the first data item by the code length 1 of the second data item in operation 542.

Next, the OR operation unit 353 performs an OR operation of the shifted code value of the first data item and the code value 1 of the second data item in operation 543.

In the processing operation 540, by using a barrel shifter, the shifting operation 542 and the OR operation 543 can be performed within one clock cycle.

Thus, by placing the operation 540 of processing the two data items into the one data item before the bitstream packing operation 550, the processing can be completed in 32 clock cycles when a data item is an 8×8 block. Accordingly, if a processed data item of an 8×8 block is completely processed in the bitstream packing operation in 32 clock cycles, the same result as processing two data items at each clock without actual idling can be obtained in the variable length coding apparatus 300.

Though an example where two data items are processed at each clock cycle is described above for convenience of explanation, by extending the structure of the prepacking unit described above, a moving picture encoding apparatus and a variable length coding apparatus capable of processing $2^N$ data items at each clock cycle can be implemented.

Figure 7:
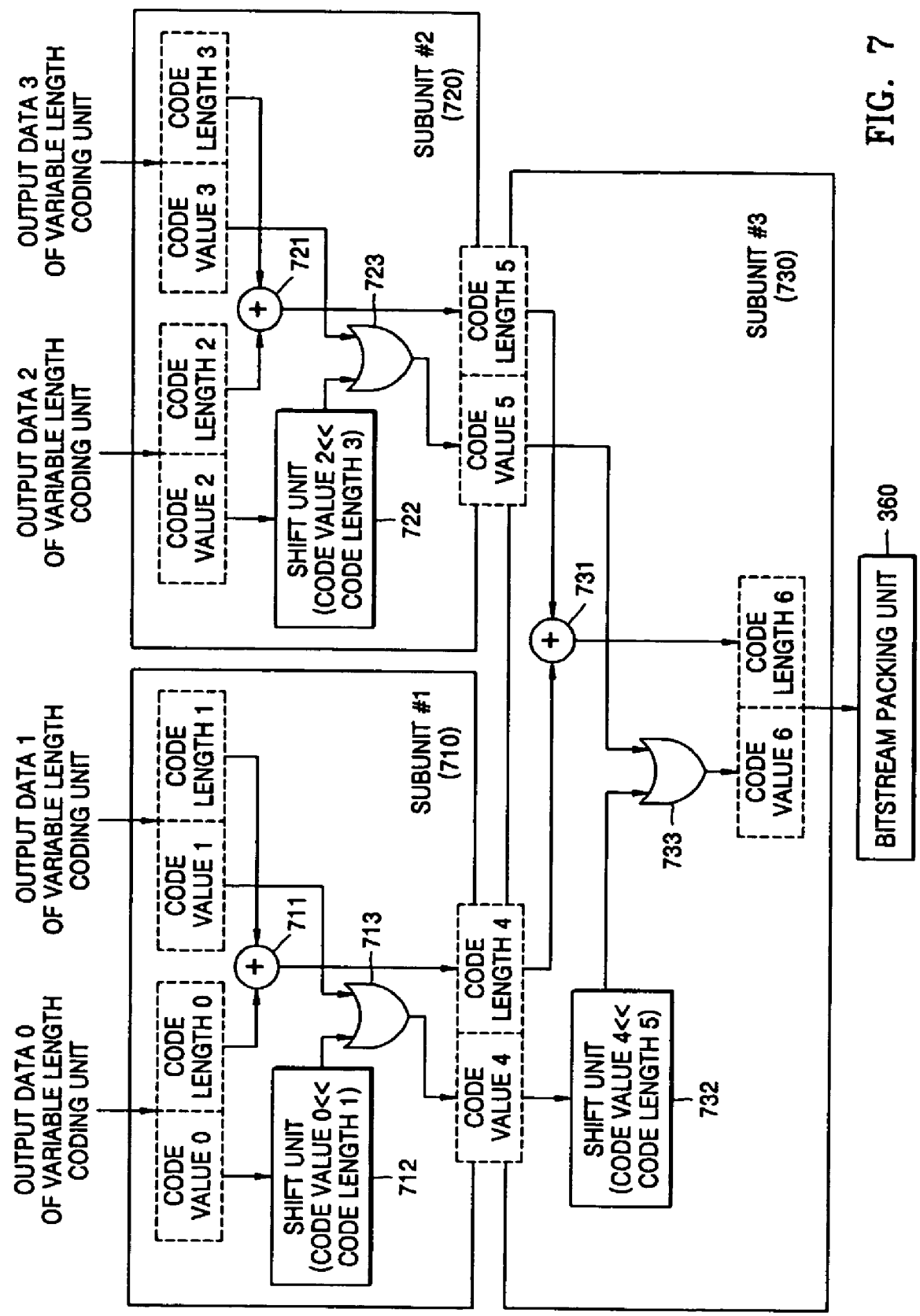
FIG. 7 is a block diagram illustrating a detailed structure of a prepacking unit which receives four data items and prepacks the four data items into one data item according to another embodiment of the present general inventive concept.

FIG. 7 is a block diagram illustrating a detailed structure of a prepacking unit which receives four data items and prepacks the four data items into one data item according to another embodiment of the present general inventive concept.

Referring to FIGS. 3 and 7, the prepacking unit may comprise a subunit #1 710, a subunit #2 720 and a subunit #3 730. Each of the subunit #1 710 and the subunit #2 720 receives two of the four data items from the variable length code generation unit 330 at each clock cycle and prepacks the two received data items into one data item. The subunit #3 receives the data items prepacked by the subunit #1 710 and the subunit #2 720 at each clock cycle and prepacks the received data items into one data item. According to the prepacking unit shown in FIG. 7 with this structure, four data items can be received and prepacked into one data item at each clock cycle. Though the first prepacked data item can be obtained in two clock cycles, data items are processed in the form of a pipeline and after two initial clock cycles, one data item can be obtained at each clock cycle.

The subunit #1 710 may comprise an addition unit 711, a shift unit 712, and an OR operation unit 713.

The subunit #1 can receive output data 0 formed with a code value 0 and a code length 0 and output data 1 formed with a code value 1 and a code length 1 output from the variable length code generation unit 330. The addition unit 711 adds the code length 0 of the output data 0 and the code length 1 of the output data 1. The shift unit 712 shifts the code value 0 of the output data 0 by the code length 1 of the output data 1. A barrel shifter can be used as the shift unit 712. The OR operation unit 713 performs an OR operation of the output value of the shift unit 712 and the code value 1 of the output data 1. Thus, with the resulting value of the OR operation unit 713 as a code value 4, and the resulting value of the addition unit 711 as a code length 4, the subunit #1 outputs a data item formed with the code value 4 and the code length 4 to the subunit #3 730.

The subunit #2 may comprise an second addition unit 721, a second shift unit 722, and a second OR operation unit 723.

The subunit #2 720 can receive output data 2 formed with a code value 2 and a code length 2 and output data 3 formed with a code value 3 and a code length 3 output from the variable length code generation unit.

The second addition unit 721 adds the code length 2 of the output data 2 and the code length 3 of the output data 3. The second shift unit 722 shifts the code value 2 of the output data 2 by the code length 3 of the output data 3. The second OR operation unit 723 performs an OR operation of the output value of the second shift unit 722 and the code value 3 of the output data 3. Thus, with the resulting value of the second OR operation unit 723 as a code value 5, and the resulting value of the second addition unit 721 as a code length 5, subunit #2 720 outputs a data item formed with the code value 5 and the code length 5 to the subunit #3 730.

The subunit #3 may comprise a third addition unit 731, a third shift unit 732, and a third OR operation unit 733.

The subunit #3 730 can receive the data item 4 formed with the code value 4 and the code length 4 output from the subunit #1 710 and the data item 5 formed with the code value 5 and the code length 5 output from the subunit #2 720.

The third addition unit 731 adds the code length 4 of the data item 4 and code length 5 of the data item 5. The third shift unit 732 shifts the code value 4 of the data item 4 by the code length 5 of the data item 5. The third OR operation unit 733 performs an OR operation of the output value of the third shift unit 732 and the code value 5 of the data item 5. Thus, with the resulting value of the third OR operation unit 733 as a code value 6, and the resulting value of the third addition unit 731 as a code length 6, the subunit #3 outputs a data item 6 formed with the code value 6 and the code length 6 to the bitstream packing unit 360.

Though a prepacking unit which receives four data items and prepacks into one data item at each clock cycle is described above, the structure of this prepacking unit can be extended. For example, in a structure of a prepacking unit where 8 data items are received at each clock cycle, four subunits to prepack the 8 data items into 4 data items are placed in a first stage, two subunits to prepack the 4 data items into 2 data items are placed in a second stage, and one subunit to prepack the 2 data items into one data item is placed in a third stage. In this case, 8 data items can be input to the prepacking unit and, though 3 clock cycles are needed for the first prepacked data output, after the 3 clock cycles, one data item can be output at each clock cycle.

According to the present general inventive concept as described above, by placing a prepacking unit which combines two data items into one data item, between a variable length code generating unit and a bitstream packing unit, a buffer for compensating for the difference of the input rate and the output rate, as described in the prior art, is not needed, and processing two data items at each clock cycle for high-speed moving picture encoding can be performed seamlessly.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A variable length coding apparatus comprising:
    a prepacking unit which modifies $2^N$ (N=1,2, . . . ) data items, each of which is formed with a code value and a code length and is received from a variable length code generator at each clock cycle, into one data item and outputs the modified data item to perform bitstream packing.

2. A variable length coding apparatus comprising:
    a variable length code generation unit to refer to a variable length code table corresponding to two input symbols received at each clock cycle to output two data items;
    a prepacking unit which receives the two data items output from the variable length code generation unit at each clock cycle, and modifies the two data items into one data item; and
    a bitstream packing unit to receive the one data item output from the prepacking unit at each clock cycle and to perform bitstream packing of the one data item.

3. The variable length coding apparatus of claim 2, wherein:
    the two data items comprise a first data item and a second data item which are output from the variable length code generation unit and formed with a code value and a code length;
    the prepacking unit comprises:
        an addition unit to add the code length of the first data item and the code length of the second data item,
        a shift unit to shift the code value of the first data item by the code length of the second data item, and
        an OR operation unit to perform an OR operation of the shifted code value of the first data item and the code value of the second data item; and the prepacking unit outputs the one data item formed with the code length output from the addition unit and the code value output from the OR operation unit at each clock cycle.

4. The variable length coding apparatus of claim 3, wherein the shifting unit comprises a barrel shifter.

5. A variable length coding apparatus comprising:
a variable length code generation unit to refer to a variable length code table corresponding to $2^N$ (N=1,2, ...) input symbols received at each clock cycle to output $2^N$ data items;
a prepacking unit which receives the $2^N$ data items output from the variable length code generation unit at each clock cycle, and modifies the $2^N$ data items into one data item; and
a bitstream packing unit to receive the one data item output from the prepacking unit at each clock cycle and to perform bitstream packing of the one data item.

6. The variable length coding apparatus of claim 5, wherein the prepacking unit comprises N stages, and each of M-th stage (M=1, ..., N) comprises $2^{N-M}$ subunits, and with $2^N$ data items output from the variable length coding unit, each subunit of M-th stage (M=1, ..., N-1) prepacks two data items into a data item and transfers the data item to subunits of (M+1)-th stage, and the subunit of N-th stage prepacks two data items into the one data item and outputs the one data item.

7. The variable length coding apparatus of claim 6, wherein:
the subunit receives two data items which comprise a first data item and a second data item, each formed with a code value and a code length;
the subunit comprises:
an addition unit to the code length of the first data item and the code length of the second data item,
a shift unit to shift the code value of the first data item by the code length of the second data item, and
an OR operation unit to perform an OR operation of the shifted code value of the first data item and the code value of the second data item; and
the subunit outputs a data item formed with the code length output from the addition unit and the code value output from the OR operation unit at each clock cycle.

8. The variable length coding apparatus of claim 7, wherein the shift unit comprises a barrel shifter.

9. A moving picture encoding apparatus comprising:
a DCT (Discrete Cosine Transfer)/quantization unit to perform DCT and quantization of data;
an RLC (Run Length Coding) unit to perform RLC of the data output from the DCT/quantization unit;
a variable length code generation unit to receive the data output from the RLC unit and to output a plurality of data items, each having a code value and a code length;
a prepacking unit which receives the plurality of data items, combines the plurality of data items into a combined data item, and outputs the combined data item; and
a bitstream packing unit to pack the combined data item into a bitstream.

10. The moving picture encoding apparatus of claim 9, wherein the plurality of data items comprises two data items.

11. The moving picture encoding apparatus of claim 9, wherein the plurality of data items comprises N data items, and N is a power of two.

12. The moving picture encoding apparatus of claim 9, wherein the plurality of data items and the combined data items are generated at each clock cycle.

13. A variable length coding method comprising:
modifying $2^N$ (N=1,2, ...) data items, each of which is formed with a code value and a code length and is received from a variable length code generator at each clock cycle, into one data item; and
outputting the modified data item for bitstream packing.

14. A variable length coding method comprising:
forming two data items by referring to a variable length code table corresponding to two input symbols received at each clock cycle;
modifying the two data items formed at each clock cycle into one data item; and
performing bitstream packing of the one data item.

15. The variable length coding method of claim 14, wherein the two data items comprise a first data item and a second data item each formed with a code value and a code length, and the modifying of the two data items into the one data item comprises:
adding the code length of the first data item and the code length of the second data item;
shifting the code value of the first data item by the code length of the second data item;
performing an OR operation of the shifted code value of the first data item and the code value of the second data item; and
outputting one data item formed with the added code length and the OR operated code value at each clock cycle.

16. A variable length coding method comprising:
forming $2^N$ data items by referring to a variable length code table corresponding to $2^N$ (N=1,2, ...) input symbols which are received at each clock cycle;
modifying the $2^N$ data items formed at each clock cycle into one data item and; and
performing bitstream packing of the one data item.

17. The variable length coding method of claim 16, wherein the modifying of the $2^N$ data items into the one data item comprises N processing stages, and each of M-th processing stage (M=1, ..., N) comprises $2^{N-M}$ prepacking stages, and each prepacking stage of the M-th stage (M=1, ..., N-1) prepacks two data items into a data item and transfers the data item to a prepacking stage of (M+1)-th stage, and the prepacking stage of (N-th stage prepacks two data items into the one data item and outputs the one data item.

18. The variable length coding method of claim 17, wherein each of the prepacking stages receives two data items comprising a first data item and a second data item each formed with a code value and a code length, and comprises operations of:
adding the code length of the first data item and the code length of the second data item;
shifting the code value of the first data item by the code length of the second data item;
performing an OR operation of the shifted code value of the first data item and the code value of the second data item; and
outputting a data item formed with the added code length and the OR operated code value output at each clock cycle.

19. A moving picture encoding method comprising:
performing discrete cosine transform (DCT) and quantizing input data;
run length coding (RLC) the quantized data;
generating a plurality of data items corresponding to the RLC data by variable length coding;

combining the plurality of data items into a single data item; and packing the combined data item into a bitstream.

20. The method of claim 19, wherein each of the plurality of data items comprises:
   a code value; and
   a code length.

21. The method of claim 20, wherein the combining of the plurality of data items into the single data item comprises:
   combining groups of two of the plurality of data items into combined data items;
   combining the combined data items until all of the plurality of data items are included in one data item.

22. The method of claim 20, wherein the plurality of data items comprise:
   a first data item; and
   a second data item.

23. The method of claim 22, wherein the combing of the of the first and second data items into the single data item comprises:
   adding the code length of the first data item and the code length of the second data item;
   shifting the code value of the first data item by the code length of the second data item; and
   performing an OR operation of the shifted code value of the first data item and the code value of the second data item.

24. The method of claim 19, wherein the plurality of data items comprise N data items, and N is a power of two.

25. A method of performing variable length coding, the method comprising:
   receiving a first data item having a first length and a first value and a second data item having a second length and a second value that corresponds to a first clock cycle;
   combining the first and second data items to obtain a third data item of a third length, which is equal to a sum of the first and second lengths, such that the first value is contained in a first portion of the third data item and the second value is contained in a second portion of the third data item; and
   outputting the third data item to correspond to the first clock cycle to a bitstream packing unit.

26. A variable length coding apparatus, comprising:
   a prepacking unit to receive a first data item having a first length and a first value and a second data item having a second length and a second value that corresponds to a first clock cycle, to combine the first and second data items to obtain a third data item of a third length, which is equal to a sum of the first and second lengths, such that the first value is contained in a first portion of the third data item and the second value is contained in a second portion of the third data item, and to output the third data item to correspond to the first clock cycle to a bitstream packing unit.

* * * * *